United States Patent [19]
Curd

[11] Patent Number: 5,561,629
[45] Date of Patent: Oct. 1, 1996

[54] LATCHING SENSE AMPLIFIER FOR A PROGRAMMABLE LOGIC DEVICE

[75] Inventor: Derek R. Curd, San Jose, Calif.

[73] Assignee: XILINX, Inc., San Jose, Calif.

[21] Appl. No.: 402,454

[22] Filed: Mar. 10, 1995

[51] Int. Cl.$^6$ .................................................. G11C 7/00
[52] U.S. Cl. ..................... 365/185.21; 365/185.29; 365/189.05; 365/207; 327/51
[58] Field of Search ....................... 365/218, 185, 365/207, 227, 185.21, 185.29, 189.05; 327/51

[56] References Cited

U.S. PATENT DOCUMENTS

| | | | |
|---|---|---|---|
| 5,023,838 | 6/1991 | Herbert | 365/207 X |
| 5,267,203 | 11/1993 | Hwang et al. | 365/227 X |
| 5,377,150 | 12/1994 | McClure | 365/207 |
| 5,386,389 | 1/1995 | Taoka | 365/205 X |

Primary Examiner—Son Dinh
Attorney, Agent, or Firm—Michael A. Glenn; Jeanette S. Harms

[57] ABSTRACT

A sense amplifier is provided that automatically determines its enabled/disabled state. The sense amplifier includes a latch to store the enable/disable signals. A global power-on-reset signal during initialization sets the state of this latch to a default configuration which disables, i.e. powers down, the sense amplifier. During configuration, an active latch enable signal forces the sense amplifier into an enable ready state. Then, a high signal is provided to each wordline associated with the bitline of the sense amplifier. This causes any erased memory cell driven by the wordlines to pull the associated bitline into a bitline low state and causes the sense amplifier output signal to switch states. This switch causes the latch to be overwritten with the opposite state, thereby enabling the sense amplifier. When the latch enable signal goes inactive after configuration of the device, the latch is set such that the sense amplifier remains enabled, i.e. powered up. If there are no erased cells on the bitline, i.e. all of the cells are programmed, then the sense amplifier output signal remains the same, and the latch is not overwritten. Thus, when the latch enable signal returns to a high state, the sense amplifier remains disabled. Therefore, any sense amplifier that is not needed in the design, indicated by the lack of erased memory cells, remains disabled. In this manner, the present invention advantageously powers down all unused sense amplifiers automatically, thereby significantly reducing power consumption and minimizing overhead while maximizing the programmability of the device.

14 Claims, 3 Drawing Sheets

LATCHING SENSE AMPLIFIER FOR A PROGRAMMABLE LOGIC DEVICE

BACKGROUND OF THE INVENTION

1. Field of the Invention

The present invention relates to a programmable logic device, and more particularly to a latching sense amplifier for a programmable logic device.

2. Description of the Related Art

Referring to FIG. 1, programmable logic devices (PLDs) typically use one or more interconnect arrays 10 that are programmed via a plurality of memory cells 12 (e.g. EPROM, EEPROM, flash EPROM, or flash EEPROM cells) to make various interconnections within the PLD that are specific to a desired design. In interconnect array 10, the control gate of a memory cell 12 is connected to a wordline 14, the drain of the cell is connected to a bitline 16, and the source of the cell is connected to ground or virtual ground.

An erased memory cell (i.e. a cell having a low threshold voltage Vt) becomes conductive if a high voltage Vcc is provided on its control gate, thereby effectively creating a connection in the array. In contrast, a programmed cell (i.e. a cell with a threshold voltage Vt above Vcc) does not become conductive if a high voltage is provided on its control gate. Thus, a programmed cell is not capable of affecting the state of bitline 16, and does not constitute an array connection.

Typically, a sense amplifier 18 is used on each bitline 16 of array 10 to sense and amplify the change of voltage on bitline 16, which may only vary by tens of millivolts, thereby achieving full logic levels at the array output line PT. Because sense amplifiers are typically in speed critical paths, sense amplifiers having very small switching delays are desirable. FIG. 2 illustrates one embodiment of sense amplifier 18.

Sense amplifier 18 is powered up or enabled by applying a logic 0 signal to line $\overline{\text{ENA}}$, thereby turning off N-channel transistor 22, and a logic 1 signal to line ENA. Thus, the voltage level on a feedback line FB is established by a weak pull-up N-channel transistor 20 which is turned on by the logic 1 signal provided on line ENA and a strong pull-down N-channel transistor 21 which is controlled by the signal on bitline 16. The voltage provided to feedback line FB controls the state of N-channel transistor 24, which operates in its linear range.

A weak P-channel transistor 26 and the strong N-channel transistor 24 provides a low trigger point at a bitline voltage on the order of 0.75 volts. If the voltage on bitline 16 transitions high, transistor 21 turns more on, thereby pulling the voltage on feedback line FB lower. This lower voltage in turn causes transistor 24 to turn more off, thereby pulling up the voltage on bitline 16 less and assisting the next movement on bitline 16 (i.e. the voltage going low). Conversely, if the voltage on bitline 16 transitions low, the voltage on feedback line FB is higher. This higher voltage in turn causes transistor 24 to turn more on, thereby pulling bitline 16 to a higher voltage (via transistor 26 which serves as a current source, and operates in saturation mode).

Thus, the voltage on line ABL is controlled by transistor 24 in conjunction with bitline 16. In response to the signal on bitline 16, ratioed inverters 27 and 28 ensure that the output voltage provided on output line PT is at CMOS levels. Table 1 shows one example of logic 0 and logic 1 voltage values on the lines 16, FB, ABL, NBL, and PT.

TABLE 1

| Signal | Logic 1 | Logic 0 | Difference |
|---|---|---|---|
| 16 | 0.769 v | 0.746 v | 0.023 v |
| FB | 1.77–1.88 v | N/A | N/A |
| ABL | 2.76 v | 2.18 v | 0.58 v |
| NBL | 0.491 v | 3.33 v | 2.84 v |
| PT | 4.4 v | 0 v | 4.4 v |

Table 1 shows that a small swing in the voltage on bitline 16 can produce a switch in the CMOS signal on output line PT.

Depending upon the state of EPROM 12 as controlled by word line 14, the voltage on bitline 16 is pulled lower or higher to indicate a logic 0 or logic 1 signal. If the signal on word line 14 is a logic 1 and assuming that EPROM 12 is erased, then the voltage on bitline 16 is pulled lower to indicate a logic 0 signal. When biased on, EPROM 12 pulls the voltage on bitline 16 toward virtual ground VG. As shown in FIG. 2, virtual ground VG is separated from actual ground by transistor 25, which is controlled by a signal on line ABL.

Sense amplifier 18, however, burns power constantly, irrespective of the voltage on bitline 16. Specifically, transistor 24 is always at least minimally on, thereby providing a current branch through conducting transistor 26, transistor 24, and transistor 23 (or additionally transistor 25 if EPROM 12 is on). Note that because of the analog signal levels provided on lines ABL and NBL, the transistors (not shown) which form inverters 27 and 28 also form current paths.

Thus, prior art sense amplifier 18 typically draws substantial amounts of DC current (on the order of a few hundred microamps) in both the bitline high and bitline low states, in addition to the large AC switching current generated during a transition in bitline state. In fact, sense amplifiers are generally responsible for drawing the majority of the DC current in a PLD. This large current draw is an undesirable side effect of high speed sense amplifiers.

Approximately 25% to 50% of the sense amplifiers in a PLD are not used in a typical user design, even when a large percentage of other resources in the device are used in the design. It would be desirable to completely shut off these unused sense amplifiers, thereby reducing the overall DC current drawn by the PLD. However, a PLD typically has hundreds of sense amplifiers. Therefore, generating the necessary information and control logic required to determine which sense amplifiers are on and off significantly increases the overhead involved in the control logic and the associated routing of control lines across the device.

Another known method to reduce the amount of power consumed by a PLD includes fitting the desired design into a minimum number of blocks within the PLD, thereby allowing unused blocks of sense amplifiers to be entirely shut down by driving the ENA signal for those blocks low. Unfortunately, this method is only effective when the desired design does not use a majority of the other logic resources in the PLD. This approach also restricts the user's flexibility in programming the PLD for a desired application, for example with regard to device pinout location.

Yet another known method to reduce the amount of power consumed by a PLD includes designing the sense amplifier such that a bitline high state consumes less power than a bitline low state. Thus, for a bitline having no connections in the design, i.e. a bitline on which all of the memory cells are programmed, the sense amplifier is always in a lower power consumption, bitline high state. This method of power control is unsatisfactory because the unused sense amplifiers nonetheless remain powered up and, therefore, still draw significant DC current.

Thus, a need arises for a sense amplifier which reduces the DC current drawn by the PLD without significantly increasing overhead and restricting the programmability of the device.

SUMMARY OF THE INVENTION

In accordance with the present invention, a sense amplifier automatically determines its enabled/disabled state. The sense amplifier includes a latch to store the enable/disable signals. A global power-on-reset signal during initialization sets the state of this latch to a default configuration which disables, i.e. powers down, the sense amplifier.

During configuration, an active latch enable signal forces the sense amplifier into an enable ready state. Then, a high signal is provided on the wordline of the sense amplifier. This causes any erased memory cell driven by the wordline to pull its associated bitline into a bitline low state, thus causing the sense amplifier output signal to switch states. This causes the latch to be overwritten with the opposite state, thereby enabling the sense amplifier. When the latch enable signal goes inactive after configuration of the device, the latch is set such that the sense amplifier remains enabled, i.e. powered up.

On the other hand, if there are no erased cells on the bitline, i.e. all of the cells are programmed, then the sense amplifier output signal remains the same, and the latch is not overwritten. Thus, when the latch enable signal returns to a high state, the sense amplifier remains disabled. Therefore, any sense amplifier that is not needed in the design, indicated by the lack of erased memory cells, remains disabled. In this manner, the present invention advantageously powers down all unused sense amplifiers automatically, thereby significantly reducing power consumption in comparison to prior art sense amplifiers, and minimizing overhead while maximizing the programmability of the device.

DETAILED DESCRIPTION OF THE DRAWINGS

Initialization of the Sense Amplifier

Figure 3:
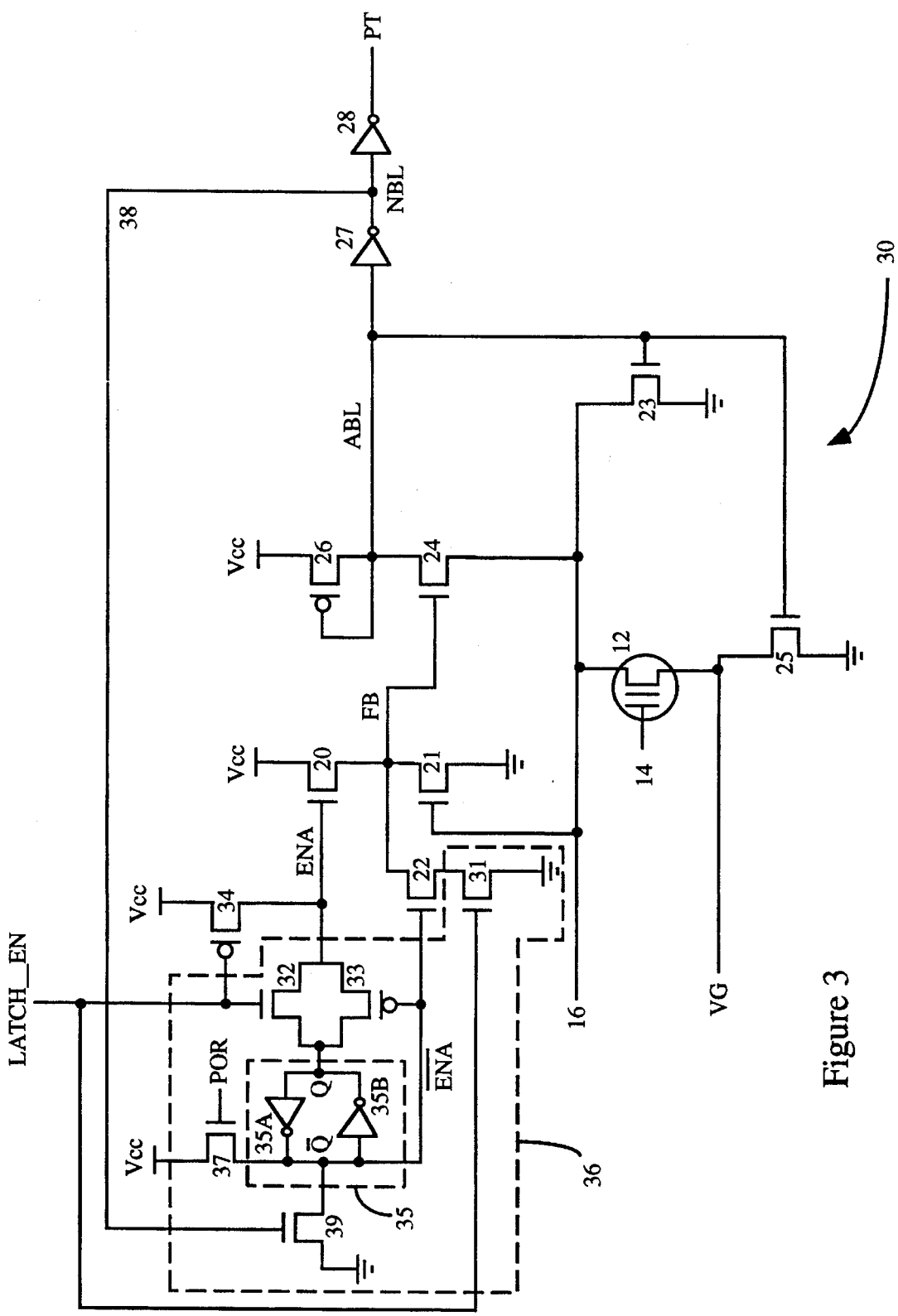
FIG. 3 is a schematic diagram of a sense amplifier for programmable logic device in accordance with the invention.

FIG. 3 illustrates a sense amplifier 30 in accordance with the present invention that includes a trigger circuit 36 to automatically determine the enabled/disabled state of sense amplifier 30. Sense amplifier 30 is initialized by a high power-on-reset (POR) signal that is supplied to trigger circuit 36. Note that if the PLD includes more than one sense amplifier, some or all of these sense amplifiers are initialized with the POR signal simultaneously.

Figure 1:
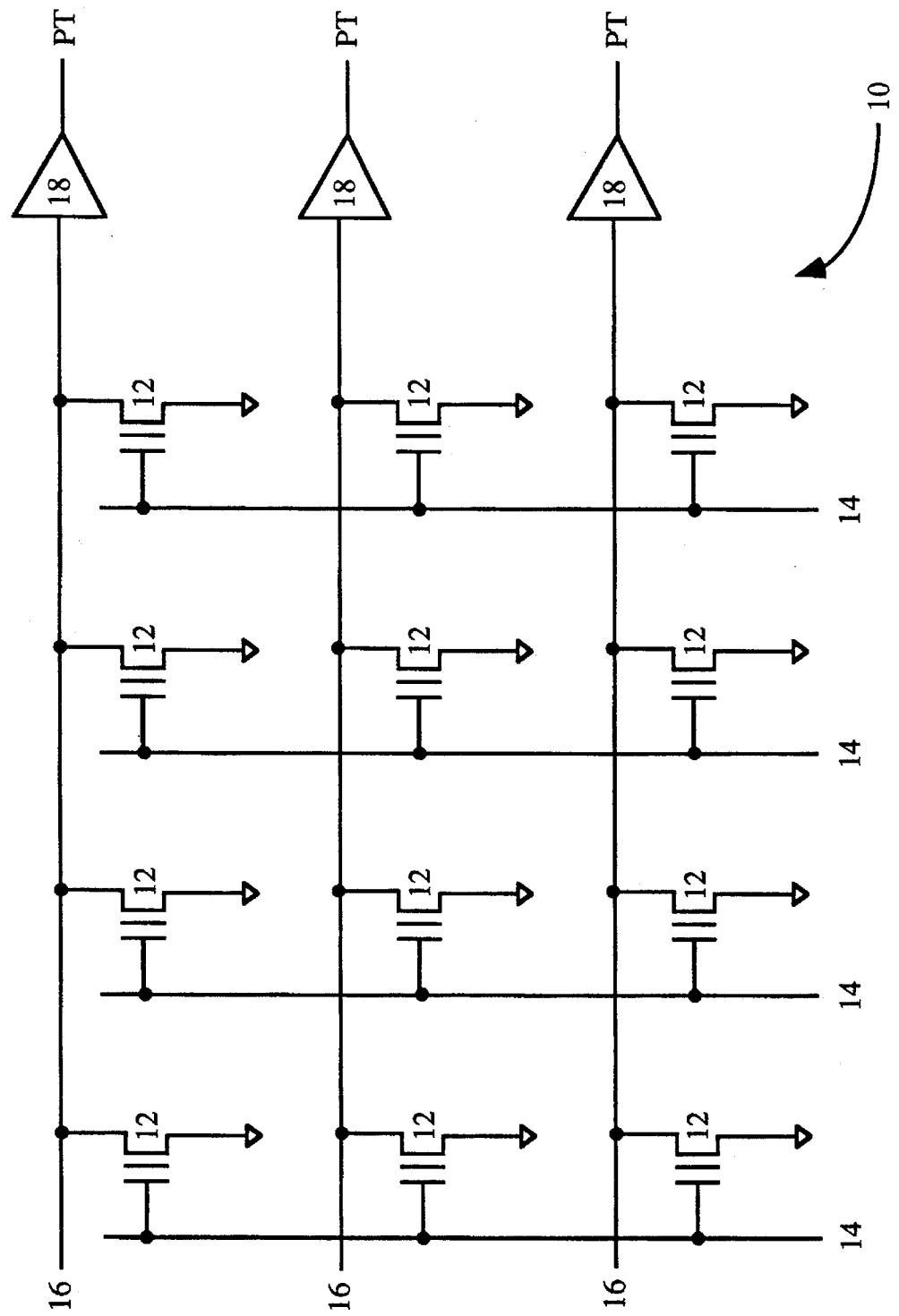
FIG. 1 is a block schematic diagram showing an interconnect array and sense amplifiers for a prior art programmable logic device.
Figure 2:
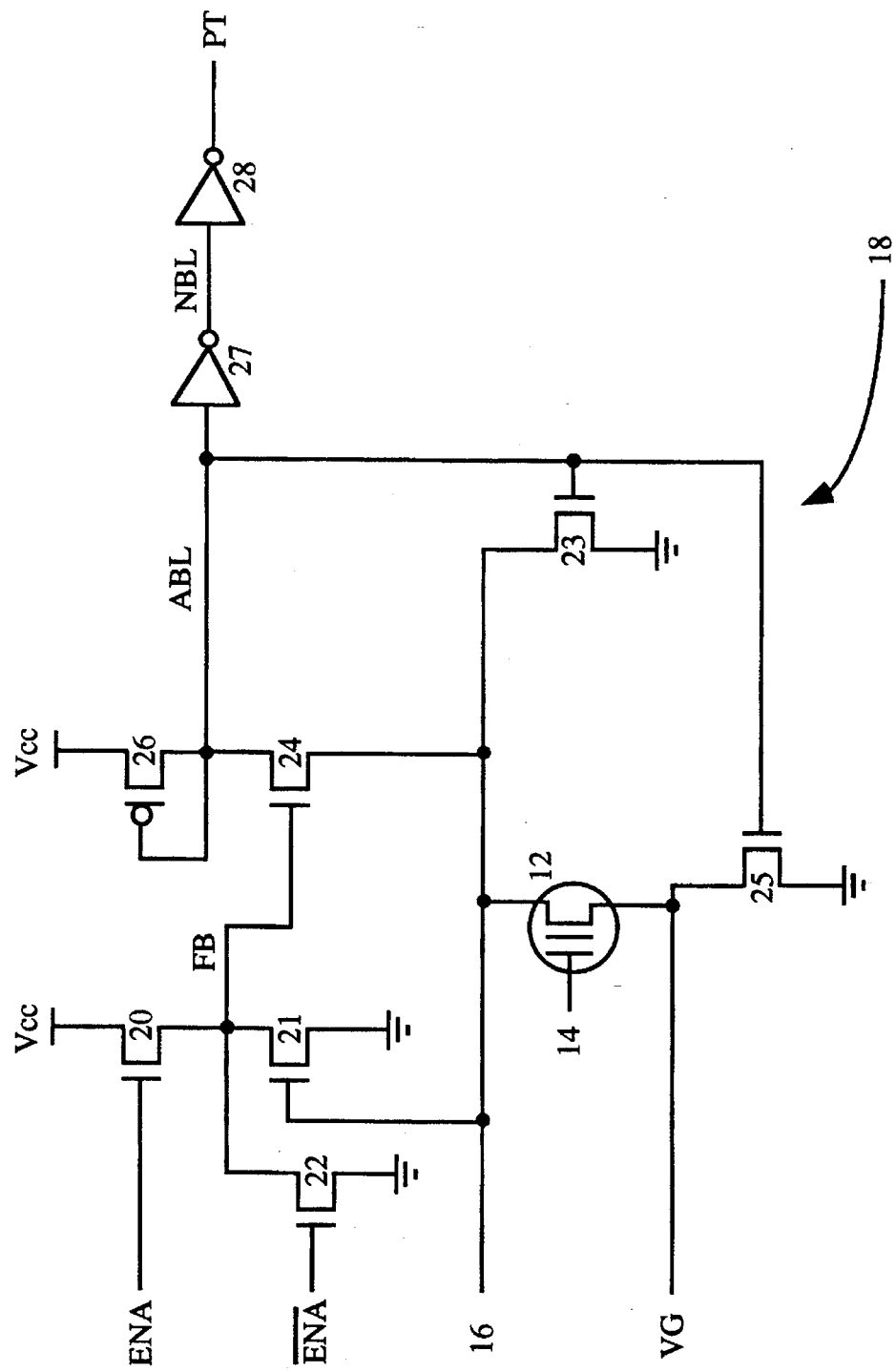
FIG. 2 is a schematic diagram of a prior art high speed sense amplifier for a programmable logic device.

The high POR signal, provided to the gate of an N-channel transistor 37, turns on that transistor, thereby transferring a high signal to latch 35.. In this embodiment, latch 35 is a conventional static latch which includes a pair of cross-coupled inverters 35A and 35B. Thus, during initialization, a high signal is stored at the $\overline{Q}$ terminal of latch 35 and a low signal is stored at the Q terminal of latch 35. The high signal on the $\overline{Q}$ terminal of latch 35, hereinafter also referred to as the $\overline{ENA}$ signal, turns on transistor 22 and turns off P-channel transistor 33. (Note that all reference numerals used for devices in FIGS. 1 and 2 represent the same devices in FIG. 3.)

During initialization, the latch enable signal LATCH_EN is high or inactive, thereby turning off a P-channel transistor 34, and turning on N-channel transistors 32 and 31. In this manner, conducting transistors 22 and 31 pull the signal on a feedback line FB low. Transistor 32, in its conducting state, transfers the low signal on the Q terminal of latch 35 to line ENA, thereby turning off transistor 20. Because no pull-up is provided to line FB, transistor 24 is off, thereby allowing conducting transistor 26 to pull-up line ABL. Because transistor 24 is nonconducting, no current path exists despite the high signal on line ABL which turns on transistors 23 and 25.

An inverter 27 inverts the high signal on line ABL and provides a low output signal on line NBL. This low signal, on a feedback loop 38, turns off an N-channel transistor 39 in trigger circuit 36. In this manner, transistor 39 is incapable of overwriting the signals stored in latch 35. The low signal on line NBL is further inverted by inverter 28, thereby providing a high output signal PT. Thus, during initialization, sense amplifier 30 is disabled (i.e. remains unresponsive to voltage changes on bitline 16), thereby drawing virtually no DC current.

Automatic Enabling of the Sense Amplifier

During configuration of the PLD, the LATCH_EN signal is brought low (i.e. active) which turns off transistor 32, thereby preventing the transfer of the signal on the Q terminal of latch 35 to line ENA and the gate of transistor 20 (note that the signal on the $\overline{Q}$ terminal of latch 35 is high, thereby turning off P-channel transistor 33). The low LATCH_EN signal turns off transistor 31, thereby preventing this transistor from pulling down the signal on line FB. In fact, the low LATCH_EN signal turns on transistor 34, thereby pulling the signal on line ENA high. Thus, the voltage level on a feedback line FB is established by weak transistor 20 which is turned on by the high signal provided on line ENA and strong transistor 21 which is controlled by the signal on bitline 16.

After the LATCH_EN signal is brought low, the signal on wordline 14 is brought high. (Note that there are typically a plurality of wordlines associated with each bitline. In one embodiment, all wordlines are brought high simultaneously, whereas in other embodiments the present invention sequences though the wordlines.) If memory cell 12 on bitline 16 is erased (indicating a connection), when the signal on wordline 14 goes high, memory cell 12 pulls down the voltage on bitline 16. A lower signal on bitline 16 turns transistor 21 more off, thereby allowing transistor 20 to pull tile signal on line FB slightly higher. The higher signal on line FB turns on transistor 24 more, thereby pulling down the signal on line ABL (via previously conducting transistor 23 and memory cell 12). Therefore, sense amplifier 30 "trips" such that the signal on line ABL goes from high to low (and resultingly, the signal on line NBL goes from low to high).

The high NBL signal turns on transistor 39 via feedback loop 38. In turn, conducting transistor 139 transfers a low signal to the Q terminal of latch 35, thereby overwriting the value stored in latch 35 during initialization. Specifically, transistor 39 forces the signal on the $\overline{Q}$ terminal low, and the signal on the Q terminal high. The low $\overline{Q}$ signal turns on transistor 33, via line ENA, thereby ensuring that transistor 20 remains on. The low $\overline{Q}$ signal turns off transistor 22, thereby allowing the signal on line FB to maintain its reference voltage level. Thus, even when the LATCH_EN signal goes inactive (high) after configuration, latch 35 is configured to maintain sense amplifier 30 in an enabled or powered up state.

On the other hand, if memory cell 12 is programmed (indicating no connection on bitline 16), then the signal on bitline 16 remains high, thereby ensuring that transistor 21 remains substantially on which in turn pulls down the signal on line FB. This relatively low signal on line FB turns off transistor 24 more, thereby allowing transistor 26 to pull up the voltage on line ABL. Thus, the output signal of sense amplifier 30 remains the same. Specifically, the signal on line NBL remains low, and latch 35 remains in its initialized configuration. therefore, sense amplifier 30 remains disabled or powered down, even after the LATCH_EN signal returns to a high state. Therefore, if sense amplifier 30 is not used in a particular design, indicated by the lack of erased memory cells, sense amplifier 30 remains disabled. In this manner, the present invention advantageously powers down all unused sense amplifiers automatically, thereby significantly reducing power consumption in comparison to prior art sense amplifiers, and minimizing overhead while maximizing the programmability of the device.

Although the invention is described herein with reference to one embodiment, those skilled in the art will readily appreciate other embodiments and variations thereof that do not depart from the spirit and scope of the present invention. For example, in one embodiment, all of the sense amplifiers that are connected to their associated bitlines are latching to permit optimal power management, whereas in other embodiments only selected sense amplifiers are latching. If a PLD includes a plurality of latching sense amplifiers, as in an interconnect array for the PLD, the rise times of the various latch enable signals may be staggered to prevent simultaneous power-up of all of the sense amplifiers, thereby preventing a large current transient within the PLD. Therefore, the invention should only be limited by the Claims set forth below.

We claim:

1. A programmable logic device comprising:
    a memory cell capable of storing either an programmed state or an erased state; and
    a sense amplifier adapted to identify said stored state, such that said sense amplifier is enabled if said stored state corresponds to an erased state, and such that said sense amplifier is disabled if said stored state corresponds to a programmed state.

2. The programmable logic device of claim 1 wherein said memory cell includes a PROM, an EPROM, an EEPROM, a flash EPROM, or a flash EEPROM cell.

3. The programmable logic device of claim 1 wherein said sense amplifier includes a trigger circuit responsive to a power-on-reset (POR) signal which initializes said sense amplifier.

4. The programmable logic device of claim 3 wherein said trigger circuit includes a latch that is reset by said POR signal.

5. The programmable logic device of claim 4 wherein said trigger circuit creates an enable ready state in said sense amplifier in response to a latch enable signal.

6. A sense amplifier comprising:
    a bitline;
    a memory cell connected to said bitline;
    means for detecting a voltage change on said bitline in said sense amplifier;
    means for propagating and amplifying said voltage change; and
    a trigger circuit including a latch for automatically enabling said sense amplifier in response to selecting said memory cell, wherein said latch receives a power-on-reset (POR) signal, thereby setting said latch in a default configuration that disables said sense amplifier.

7. The sense amplifier of claim 6 wherein said trigger circuit includes a first transistor having a gate, a source, and a drain, wherein said gate receives said POR signal, wherein said drain is coupled to a first voltage source, and wherein said source is coupled to one terminal of said latch.

8. The sense amplifier of claim 7 wherein said trigger circuit further includes a reset circuit coupled to the output line of said sense amplifier and said one terminal of said latch.

9. The sense amplifier of claim 8 wherein said reset circuit includes a feedback line and a second transistor having a gate, a source, and a drain, wherein said feedback line is coupled to said output line of said sense amplifier and to said gate of said second transistor, said source of said second transistor is coupled to a second voltage source, and said drain of said second transistor is coupled to said one terminal of said latch.

10. The sense amplifier of claim 9 wherein said trigger circuit further includes a latch enable circuit for providing an enable ready state in said sense amplifier.

11. A method for automatically enabling a sense amplifier comprising the steps of:
    storing either a programmed state or an erased state in a memory cell; and
    identifying the stored state with a sense amplifier such that said sense amplifier is enabled if said stored state corresponds to said erased state, and such that said sense amplifier is disabled if said stored state corresponds to said programmed state.

12. The method of claim 11 wherein said memory cell is either a PROM, an EPROM, an EEPROM, a flash EPROM, or a flash EEPROM cell.

13. The method of claim 11, further comprising the step of:
    initializing said sense amplifier with an enable circuit in response to a power-on-reset (POR) signal.

14. The method of claim 13, further comprising the step of:
    resetting a latch with said POR signal.

* * * * *